(12) United States Patent
Turner

(10) Patent No.: US 10,193,646 B2
(45) Date of Patent: Jan. 29, 2019

(54) BANDWIDTH EXTENSION FOR TRUE SINGLE-PHASE CLOCKED MULTIPLEXER

(71) Applicant: BAE Systems Information and Electronic Systems Integration Inc, Nashua, NH (US)

(72) Inventor: Steven E. Turner, Nashua, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 85 days.

(21) Appl. No.: 15/608,640

(22) Filed: May 30, 2017

(65) Prior Publication Data
US 2018/0351677 A1    Dec. 6, 2018

(51) Int. Cl.
| | |
|---|---|
| H04J 3/06 | (2006.01) |
| G06F 1/10 | (2006.01) |
| H04J 3/04 | (2006.01) |
| H04W 56/00 | (2009.01) |
| H03K 3/012 | (2006.01) |

(52) U.S. Cl.
CPC .............. *H04J 3/0685* (2013.01); *G06F 1/10* (2013.01); *H03K 3/012* (2013.01); *H04J 3/047* (2013.01); *H04W 56/0015* (2013.01)

(58) Field of Classification Search
CPC .................................................. H04J 3/0685
USPC ............................................................ 327/99
See application file for complete search history.

(56) References Cited

U.S. PATENT DOCUMENTS

| 6,593,780 B2 * | 7/2003 | Lammers ................. G06F 1/08 327/294 |
| 8,487,662 B2 * | 7/2013 | Kao ................. H03K 17/04163 327/403 |
| 8,829,944 B1 * | 9/2014 | Miller .............. H03K 3/356104 327/427 |

* cited by examiner

*Primary Examiner* — Hai L Nguyen
(74) *Attorney, Agent, or Firm* — Finch & Maloney PLLC (57) ABSTRACT

A true single-phase clocked multiplexer for outputting one of a plurality of input signals in synchronization with a clock signal and as selected by at least one select signal is provided. The multiplexer includes first transistors, second transistors, a first node between the first transistors, a second node between the second transistors, a third node coupled to the first node by one of the first transistors and to the second node by one of the second transistors, and a pre-charge transistor to couple the third node to a first voltage level. The first transistors are coupled to the first voltage level and configured to turn on in response to a gate voltage of a second voltage level different from the first voltage level. The second transistors are coupled to the second voltage level and configured to turn on in response to a gate voltage of the first voltage level.

20 Claims, 6 Drawing Sheets

BANDWIDTH EXTENSION FOR TRUE SINGLE-PHASE CLOCKED MULTIPLEXER

STATEMENT REGARDING FEDERALLY SPONSORED RESEARCH OR DEVELOPMENT

This invention was made with government support under W911QX-13-C-0050 awarded by the U.S. Army. The government has certain rights in the invention.

BACKGROUND

The topology of a high-speed multiplexer (MUX) implemented with true single-phase clock/clocked/clocking (TSPC) logic can be prone to glitches or errors at lower clock rates. While TSPC logic is a dynamic logic family intended for high-speed operation, it is often advantageous to run TSPC circuits at lower frequencies. For the TSPC MUX, charges can be transferred between two floating nodes on the circuit. This charge transfer can, for example, reduce the voltage of a node that should remain in a logic high state. With a slightly lower voltage on this node, a subsequent transistor can turn on weakly and pull the voltage high of a subsequent node that should remain low. This can cause a glitch at the output of the circuit.

BRIEF DESCRIPTION OF THE DRAWINGS

Features of embodiments of the claimed subject matter will become apparent as the following Detailed Description proceeds, and upon reference to the Drawings, wherein like numerals depict like parts.

Although the following Detailed Description will proceed with reference being made to illustrative embodiments, many alternatives, modifications, and variations thereof will be apparent to those in light of the present disclosure.

DETAILED DESCRIPTION

A true single-phase clocked (TSPC) multiplexer (MUX) is provided for outputting one of a plurality of input signals in synchronization with a first clock signal and as selected by at least one select signal. The MUX includes a plurality of first transistors (e.g., PMOS transistors), a plurality of second transistors (e.g., NMOS transistors), a first node between ones of the first transistors, a second node between ones of the second transistors, a third node electrically connected to the first node by one of the first transistors and to the second node by one of the second transistors, and a pre-charge transistor to electrically connect the third node to a first power source for supplying a first voltage level (e.g., Vdd).

The first transistors are electrically connected to the first power source and configured to turn on in response to a gate voltage of a second voltage level (e.g., Vss) different from the first voltage level. The second transistors are electrically connected to a second power source for supplying the second voltage level and configured to turn on in response to a gate voltage of the first voltage level. The first node has a voltage level configured to take on or otherwise be set to one of the first voltage level, the second voltage level, and a first floated voltage level. The first floated voltage level is between and different from the first and second voltage levels. The first node voltage level at any given time depends on the input signals, the select signal, and the first clock signal. At different times, the first node takes on each of the first voltage level, the second voltage level, and the first floated voltage level.

In a similar fashion, the second node has a voltage level configured to take on or otherwise be set to one of the first voltage level, the second voltage level, and a second floated voltage level. The second floated voltage level is between and different from the first and second voltage levels. The second node voltage level at any given time depends on the input signals, the select signal, and the first clock signal. At different times, the second node takes on each of the first voltage level, the second voltage level, and the second floated voltage level.

General Overview

The topology of a high-speed MUX implemented with TSPC logic can be prone to glitches or errors at lower clock rates. While TSPC logic is a dynamic logic family intended for high-speed operation, it is often advantageous to run TSPC circuits at lower frequencies. For a TSPC serializing MUX, which time multiplexes (e.g., serializes), for example, four input channels into a single output channel, charges can be transferred between two floating nodes on the circuit. For instance, a first node transferring voltage to a third node as controlled by a set of nested clock signals can transfer a floating voltage from the first node to the floating third node. This charge transfer can, for example, reduce the voltage of the third node that should remain in a logic high state. With the slightly lower voltage on the third node, a subsequent transistor controlled by the third node can turn on weakly and pull the voltage high on a subsequent (e.g., fourth) node that should remain low. This can cause a glitch at the output of the circuit.

Thus, and in accordance with an embodiment, a pre-charge transistor is added to the node that is prone to charge transfer (such as the third node in the above example). This ensures that the voltage stays high, and that the subsequent transistor remains in a fully off state and is not weakly turned on. This solution enables the circuit to run at lower frequencies while not impacting performance at high frequencies.

Throughout, it is assumed that the MUX accepts a plurality (such as a power-of-two number) of input signals and outputs one of these input signals as an output signal as selected by one or more select signals. For example, there may be as many select signals as the base-two logarithm of the number of input signals. For ease of description and implementation, a corresponding one or more inverted select signals (that are inverted versions of their respective select signals) may also be provided, but in general, a select signal and its inverted signal will be considered a single select signal throughout. Further, the output signal can be a corresponding equivalent signal of the selected input signal, such as the selected input signal or the complement of the selected input signal. It is also assumed that the MUX is driven (e.g., synchronized) by a single-phase clock signal, such as a single clock signal delivered to the circuits of the MUX, for example, by a single wire and having a low state and a high state, and without also supplying an inverted version of the clock signal to the MUX.

Architecture and Methodology

Figure 1:
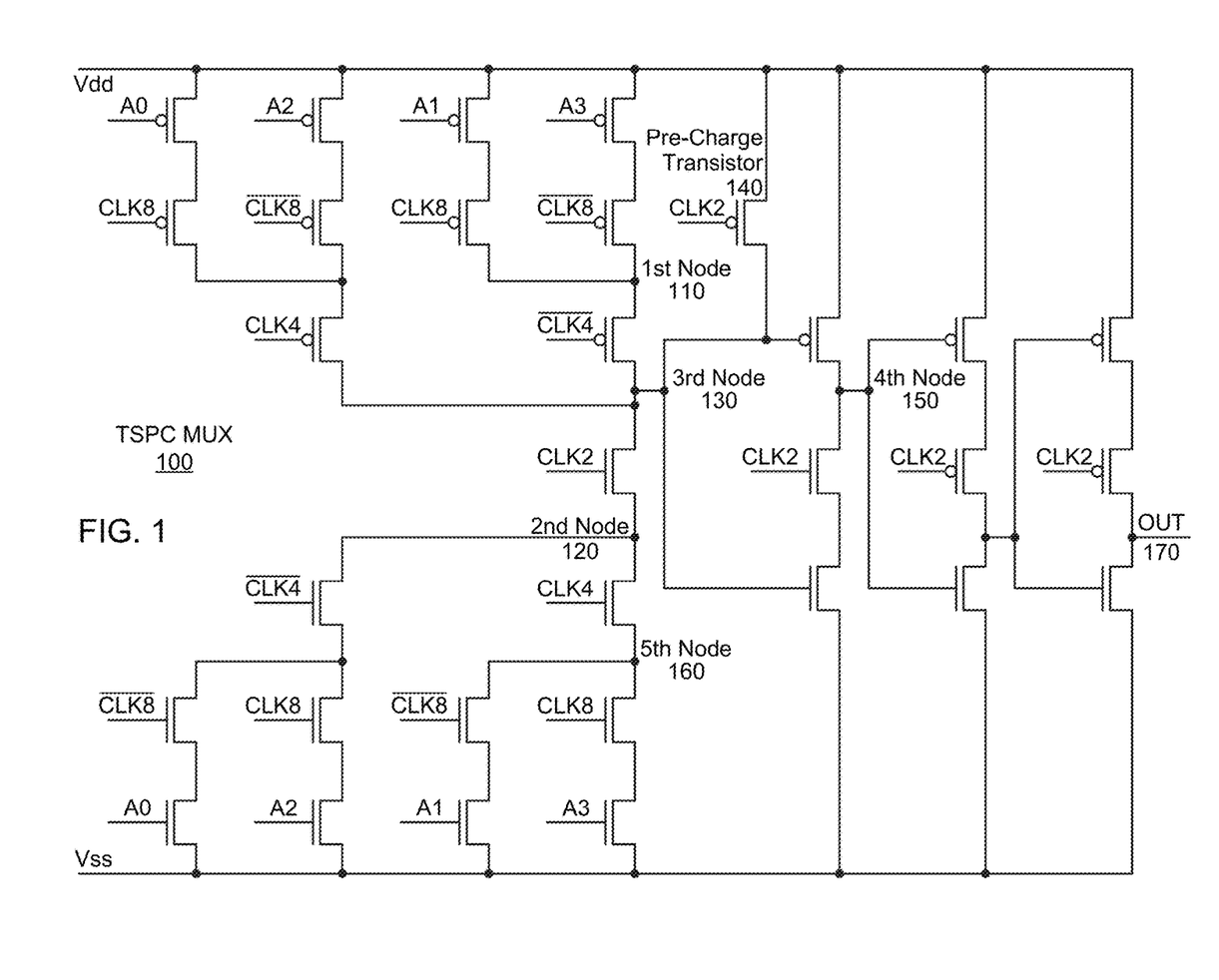
FIG. 1 is a circuit diagram of an example TSPC serializing MUX, according to an embodiment of the present disclosure.
Figure 2:
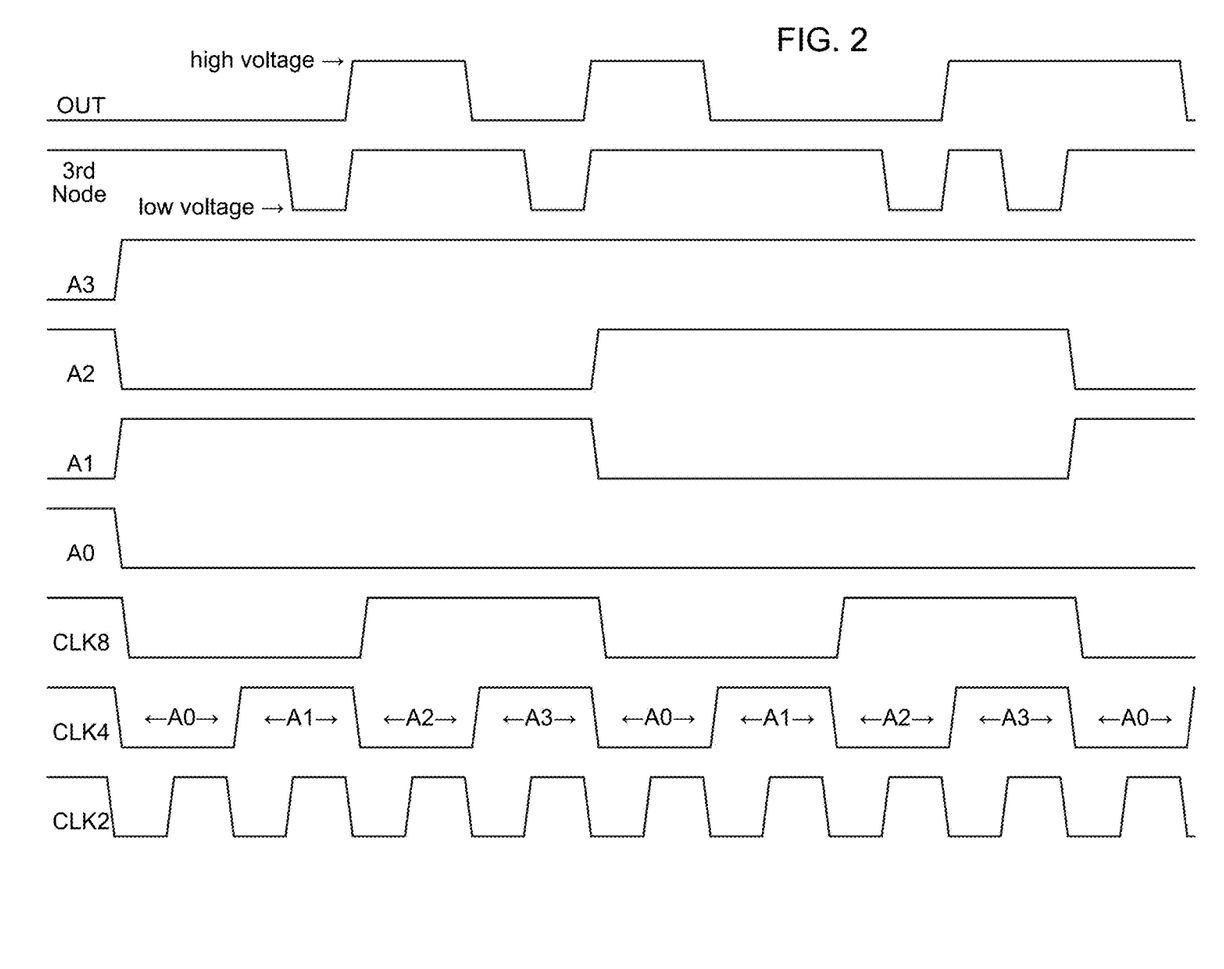
FIG. 2 is an example timing diagram of nine signals for driving the MUX of FIG. 1, according to an embodiment of the present disclosure.

FIG. 1 is a circuit diagram of an example TSPC serializing MUX 100, according to an embodiment of the present disclosure. FIG. 2 is an example timing diagram of nine signals for driving the MUX 100 of FIG. 1, according to an embodiment of the present disclosure. The MUX 100 of FIG. 1 is a complementary metal-oxide-semiconductor (CMOS) circuit including a set of p-type metal oxide semiconductor field effect transistors (p-type MOSFETs, or PMOS transistors) at the top (connected to a voltage source, such as high voltage or Vdd) and a set of n-type MOSFETs (or NMOS transistors) at the bottom (connected to ground, such as a low voltage, GND, or Vss). As used herein, high voltage is sufficiently high gate voltage to turn on an NMOS transistor while low voltage is sufficiently low gate voltage to turn on a PMOS transistor. The timing diagram of FIG. 2 is a simplified illustration of many of the input, output, and intermediate signals. The timing diagram illustrates each signal alternating (in the y-direction, or vertically) between a high value (e.g., logic one, such as Vdd) and a low value (e.g., logic zero, such as Vss), with steeply sloping lines representing the transition between the two values, and time being represented (from left to right) in the x-direction (or horizontally).

The TSPC serializing MUX 100 has one output signal (OUT) clocked by a first clock signal (CLK2), such as a single-phase clock signal, and first through fourth input signals (A0, A1, A2, and A3) time-selected by a combination of second and third clock signals (CLK4 and CLK8) and their complements. The second clock signal CLK4 has half the frequency of the first clock signal CLK2 and the third clock signal CLK8 has half the frequency of the second clock signal CLK4. Accordingly, there is a full cycle of the first clock signal CLK2 for each logical combination of the second and third clock signals CLK4 and CLK8. Example timing patterns of all eight of these input, output, and clock signals are illustrated in FIG. 2.

For example, and as annotated on the second clock signal CLK4 portion of the timing diagram of FIG. 2, the first input signal A0 can be selected by both the second and third clock signals CLK4 and CLK8 having low values (e.g., logic zero, such as ground voltage or GND), the second input signal A1 can be selected by the second clock signal CLK4 having a high value (e.g., logic one, such as high voltage or Vdd) and the third clock signal CLK8 having a low value, the third input signal A2 can be selected by the second clock signal CLK4 having a low value and the third clock signal CLK8 having a high value, and the fourth input signal A3 can be selected by both the third and fourth clock signals CLK4 and CLK8 having high values.

During the high portion of the first clock signal CLK2, one of the first through fourth input signals A0, A1, A2, and A3 (as selected by a corresponding combination of the second and third clock signals CLK4 and CLK8) is stored at a fourth node 150, as controlled by the negation of the selected input signal being stored at a third node 130. For example, as selected by the second or fourth input signals A1 or A3 in combination with the third clock signal CLK8, either a high voltage (such as logic one) is transferred to a first node 110 or a low voltage (such as logic zero) is transferred to a fifth node 160. At this point, when the second clock signal CLK4 is high, the high voltage is transferred to the third node 130 or the low voltage is transferred to a second node 120. Then, when the first clock signal CLK2 is high, the third node 130 either remains at the high voltage or is changed to the low voltage, depending on whether the high voltage was first transferred to the first node 110 or the low voltage was first transferred to the fifth node 160 as described above.

It should be noted that the voltage level of interior nodes of the MUX 100, such as the first node 110, can float during clock cycles for which their corresponding input signals are not being selected, as well as during periods when the first clock signal CLK2 is high. For example, when the second and fourth input signals A1 and A3 are high, and the second clock signal CLK4 is low, then the first node 110 stays floated. Further, even if in this scenario, the second input signal A1 is instead low, then when the third clock signal CLK8 is high, the first node 110 still remains floated. Over time, a floated node can change voltage due to factors such as leakage or electrical connection to other floated nodes having different voltages.

In further detail, when interior nodes are floated, they can take on or otherwise be configured to receive voltage levels between the high voltage and the low voltage (such as being electrically connected to other floating nodes that have different voltage levels before the electrical connection). Such floating nodes can also undergo voltage leakage, which causes variation or deviation between the intended voltage levels of the nodes and the actual levels. Moreover, when the clock signals are slowed down, the length of time interior nodes (such as the first node 110) remain floated increases, which increases voltage leakage of such nodes, which can increase the variation of intended voltage levels from the actual levels. This can increase the likelihood such nodes reach invalid states and, in the absence of circuits such as the pre-charge transistor 140 (described further below), can lead to errors or invalid values in the output signal 170.

A similar process takes place when the second clock signal CLK4 is low, except the high or low voltage at the third node 130 is determined by the first or third input signals A0 or A2 in combination with the third clock signal CLK8. Accordingly, during the high portion of the first clock signal CLK2, the negation (or complement) of the selected input signal is dynamically stored at the third node 130, while the selected input signal is dynamically stored at the fourth node 150. Then, during the subsequent low portion of the first clock signal CLK2, the selected input signal at the fourth node 150 is transferred to the output signal OUT.

In addition to the above circuits or transistors, the MUX 100 further includes a pre-charge transistor 140 that initializes or pre-charges the third node 130 to high voltage whenever the first clock signal CLK2 is low. The MUX 100 is a dynamic logic circuit. Accordingly, many of the interior nodes of the circuit, such as the first node 110, second node 120, and fifth node 160, are floating nodes whose values may change from one clock cycle to the next even when they are not electrically connected (e.g., by a series of turned-on circuits or transistors) to high voltage Vdd or low voltage Vss.

For example, if the second node 120 has a high voltage and the fifth node 160 has a low voltage, then when the second clock signal CLK4 is high, the second and fifth nodes 120 and 160 are electrically connected, which decreases the voltage of the second node 120 and increases the voltage of the fifth node 160. For another example, absent the pre-charge transistor 140, if the first node 110 has a low voltage and the third node 130 has a high voltage, then when the second clock signal CLK4 is high, the first and third nodes 110 and 130 are electrically connected, which increases the voltage of the first node 110 and decreases the voltage of the third node 130 (with corresponding increases to the fourth node 150 and possibly unintended increases to the output signal 170).

However, in the MUX 100 of FIG. 1 with the pre-charge transistor 140, if this takes place when the first clock signal CLK2 is high, then the first, second, third, and fifth nodes 110, 120, 130, and 160 are all electrically connected, with either the first node 110 being electrically connected to the high voltage (e.g., Vdd) or the fifth node 160 being electrically connected to the low voltage (e.g., Vss). Accordingly, the third node 130 is set to either the high or low voltage. Further, if the above takes place when the first clock signal CLK2 is low, then the first and third nodes 110 and 130 are electrically connected to each other and to the high voltage (e.g., Vdd) through the pre-charge transistor 140, so the third node 130 is set to the high voltage. In other words, because of the pre-charge transistor 140, differences in voltages of adjacent floating nodes in the MUX 100 do not cause unintended changes to the voltage of the third node 130 (and, by extension, the fourth node 150 or the output signal 170).

The MUX 100 uses dynamic logic. Accordingly, state information can be (dynamically) stored between clock cycles as floating voltages on interior nodes (floated or floating nodes), e.g., nodes not electrically connected to either the high voltage (Vdd) or the low voltage (Vss) for some of the clock cycles, such as at the first node 110 or the fifth node 160. At normal (such as high-speed) clocking of the first clock signal CLK2, this is not a significant concern. However, when slowed down (e.g., to speed match to a particular channel being driven by the output signal 170), the MUX 100, and in particular the voltages at the floating nodes, may experience greater than designed-for voltage leakages, which can result in invalid states of the MUX 100. This can be exacerbated when two such floating nodes holding significantly different floating voltages are electrically connected by a connecting transistor that is turned on by a select signal that is active while the nodes are still floated. When one of these floated nodes represents the selected input signal (such as the third node 130 of the MUX 100 when there is no pre-charge transistor 140), such a sharing of voltages between floated nodes can affect the output signal 170.

Accordingly, by including the pre-charge transistor 140, the third node 130 should either be at the high voltage when the first clock signal CLK2 is low, or the third node 130 should be at the negation of the selected input signal when the first clock signal CLK2 is high. As such, the voltage at the third node 130 should not float or otherwise be affected by voltage changes in other nodes, such as the first node 110.

Figure 3:
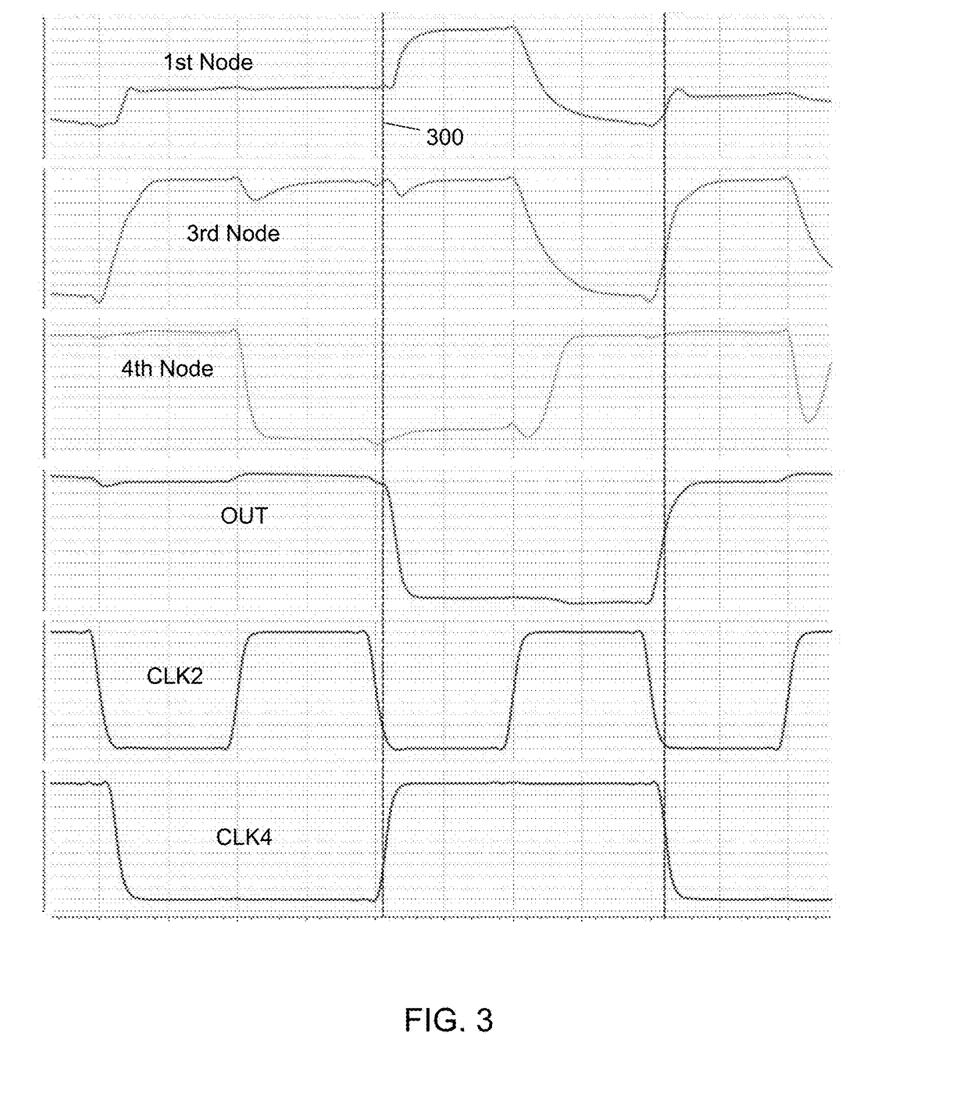
FIG. 3 is an example simulation timing diagram of six signals for driving the MUX of FIG. 1 with a pre-charge transistor and a set of input signals, according to an embodiment of the present disclosure.
Figure 4:
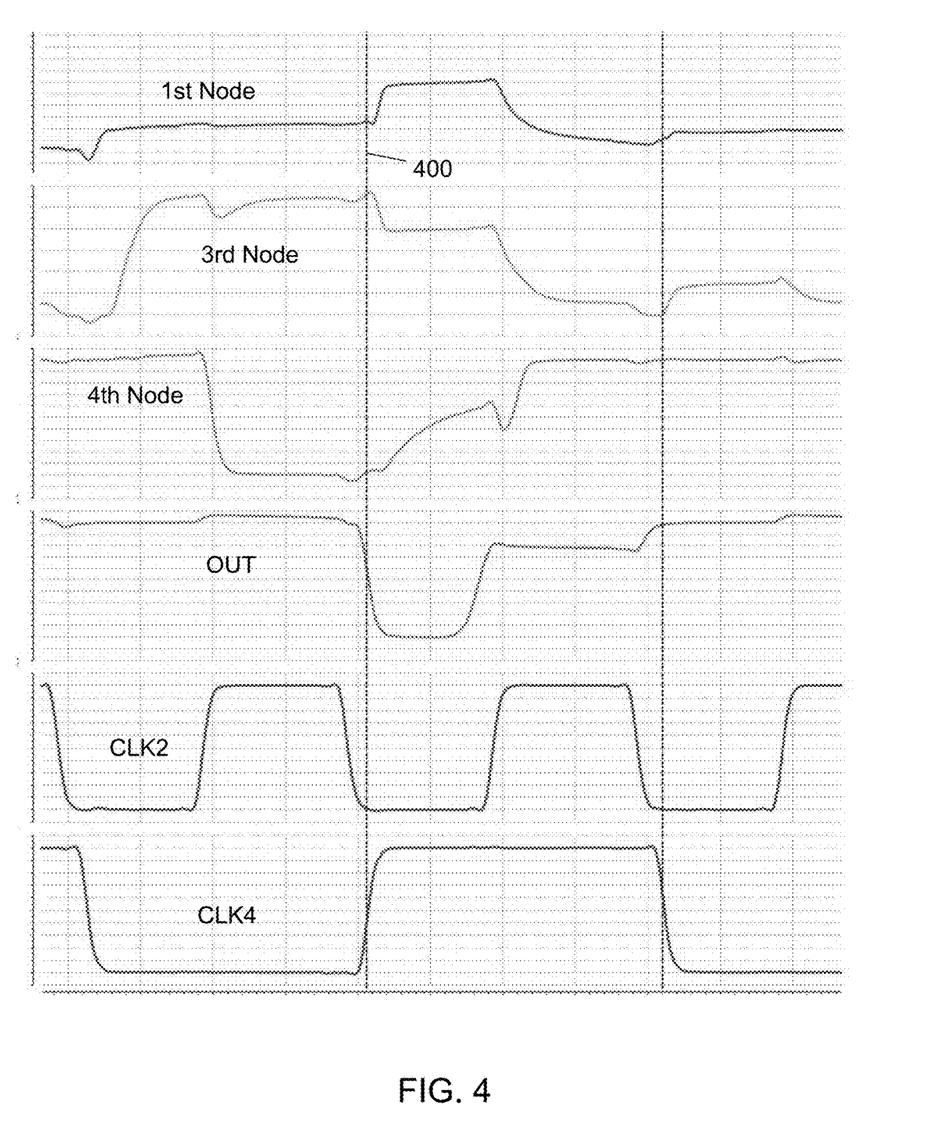
FIG. 4 is an example simulation timing diagram of the same six signals of FIG. 3 for driving the MUX of FIG. 1 without a pre-charge transistor but with the same input signals as used to produce FIG. 3.

FIG. 3 is an example simulation timing diagram of six signals for driving the MUX 100 of FIG. 1 with a pre-charge transistor and a set of input signals, according to an embodiment of the present disclosure. FIG. 4 is an example simulation timing diagram of the same six signals of FIG. 3 for driving the MUX 100 of FIG. 1 without the pre-charge transistor 140 but with the same input signals as used to produce FIG. 3. That is, the circuit used to generate the data in FIG. 4 is a comparative example to the circuit used to generate the data in FIG. 3, to help compare the effects of the pre-charge transistor 140 on the internal and external signals generated by the MUX 100 of FIG. 1. In FIGS. 3-4, the waveforms of the six signals are illustrated, namely the first node 110, the third node 130, the fourth node 150, the output signal 170, the first clock signal CLK2, and the second clock signal CLK4, as derived from an integrated circuit (IC) simulation tool for simulating the driving of the MUX 100 of FIG. 1 and similar circuits (such as the MUX 100 of FIG. 1 without the pre-charge transistor 140, as used to derive the data illustrated in FIG. 4).

As can be seen in FIG. 3, the output signal OUT is similar but half a clock cycle (of the first clock signal CLK2) behind that of the fourth node 150, which maintains the inverse signal of the third node 130 during the high portions of the first clock signal CLK2. Further, the third node 130 is not significantly affected by changes of the voltage of the first node 110 when the second clock signal CLK4 goes high, such as at time 300 and shortly thereafter.

By contrast, as can be seen in FIG. 4, at time 400 (similar in time to time 300 of FIG. 3), despite the same input signals, the second clock signal CLK4 going high causes the voltage of the third node 130 to drop because there is no pre-charge transistor 140, so the low floating voltage of the first node 110 is brought up and the high floating voltage of the third node 130 is pulled down. This in turn causes the voltage of the fourth node 150 to increase (because of the PMOS transistor connected to the fourth node 150 and controlled by the third node 130 being slightly turned on by the decreasing voltage of the third node 130) with a corresponding unintended increase in the output signal OUT.

Figure 5:
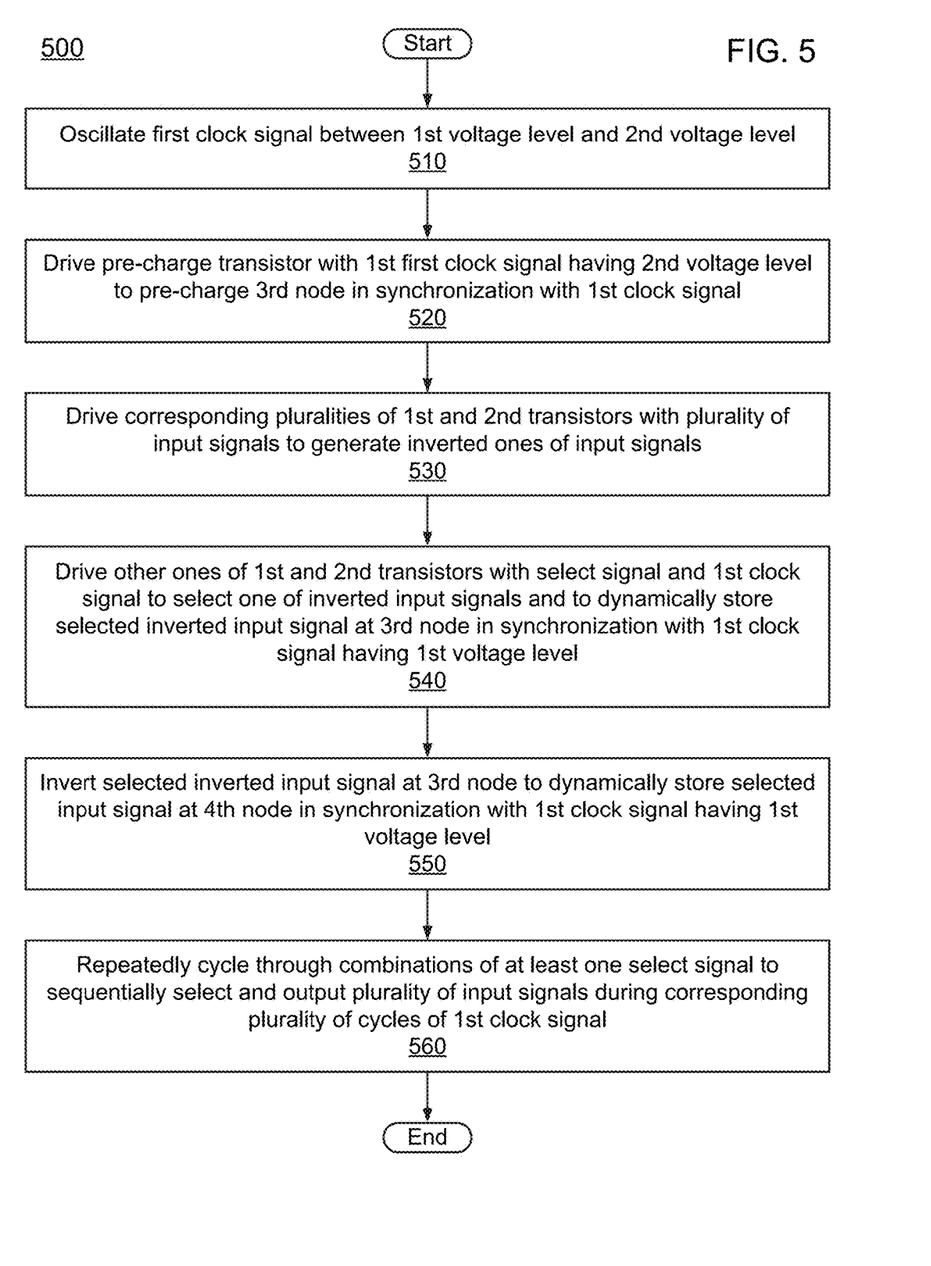
FIG. 5 is a flowchart illustrating an example method of driving a TSPC serializing MUX, according to an embodiment of the present disclosure.

FIG. 5 is a flowchart illustrating an example method 500 of driving a TSPC serializing MUX, according to an embodiment of the present disclosure. As can be seen, example method 500 includes a number of phases and sub-processes, the sequence of which may vary from one embodiment to another. However, when considered in the aggregate, these phases and sub-processes form processes for driving a TSPC serializing MUX, according to some embodiments of the present disclosure. These embodiments can be implemented, for example, using the MUX 100 illustrated in FIG. 1 and driving signals illustrated in FIGS. 2-3 as described above. However, other system architectures can be used in other embodiments, as will be apparent in light of this disclosure. To this end, the correlation of the various functions shown in FIG. 5 to the specific components illustrated in FIGS. 1-3 is not intended to imply any structural or use limitations. Rather, other embodiments may include, for example, varying degrees of integration wherein multiple functionalities are effectively performed by one system. Numerous variations and alternative configurations will be apparent in light of this disclosure.

In FIG. 5, and with reference to FIGS. 1-3, the TSPC MUX 100 is for outputting one of a plurality of input signals A0-A3 in synchronization with a first clock signal CLK2 and as selected by at least one select signal CLK4 and CLK8. The MUX includes: a plurality of first (PMOS) transistors electrically connected to a first (Vdd) power source for supplying a first voltage level Vdd and configured to turn on in response to a gate voltage of a second voltage Vss level different from the first voltage level Vdd; a plurality of second (NMOS) transistors electrically connected to a second (Vss) power source for supplying the second voltage level Vss and configured to turn on in response to a gate voltage of the first voltage level Vdd; a first node 110 between ones of the PMOS transistors and configured to take on or otherwise configured to receive each of the first voltage level Vdd, the second voltage level Vss, and a first floated voltage level, the first node voltage level depending at any given time on the input signals A0-A3, the select signal CLK4 and CLK8, and the first clock signal CLK2, the first floated voltage level being between and different from the first and second voltage levels Vdd and Vss; a second node 120 between ones of the NMOS transistors and configured to take on or otherwise configured to receive each of the first voltage level Vdd, the second voltage level Vss, and a second floated voltage level, the second node voltage level depending at any given time on the input signals A0-A3, the select signal CLK4 and CLK8, and the first clock signal CLK2, the second floated voltage level being between and different from the first and second voltage levels Vdd and Vss; a third node 130 electrically connected to the first node 110 by one of the PMOS transistors and to the second node 120 by one of the NMOS transistors; and a pre-charge transistor 140 to electrically connect the third node 130 to the Vdd power source.

The method 500 includes: oscillating 510 the first clock signal between the first voltage level and the second voltage level; driving 520 the pre-charge transistor with the first clock signal having the second voltage level to pre-charge the second node in synchronization with the first clock signal; driving 530 corresponding pluralities of the first and second transistors with the plurality of input signals to generate inverted ones of the input signals; driving 540 other ones of the first and second transistors with the select signal and the first clock signal to select one of the inverted input signals and to dynamically store the selected inverted input signal at the third node in synchronization with the first clock signal having the first voltage level; inverting 550 the selected inverted input signal at the third node to dynamically store the selected input signal at a fourth node in synchronization with the first clock signal having the first voltage level; and repeatedly cycling 560 through combinations of the at least one select signal to sequentially select and output the plurality of input signals during a corresponding plurality of cycles of the first clock signal.

In another embodiment, the method 500 further includes double inverting the selected input signal at the fourth node to output the selected input signal in synchronization with the first clock signal having the second voltage level. In some embodiments, the plurality of input signals includes four input signals and the at least one select signal includes a second clock signal and a third clock signal. The method 500 further includes driving the second clock signal at half the frequency of the first clock signal and driving the third clock signal at half the frequency of the second clock signal.

Referring back to FIG. 1, in some embodiments of the present disclosure, a true single-phase clocked (TSPC) multiplexer (MUX) 100 for outputting one of a plurality of input signals A0-A3 in synchronization with a first clock signal CLK2 and as selected by at least one select signal CLK4 and CLK8 is provided. The MUX 100 includes a plurality of first (PMOS) transistors electrically connected to a first (Vdd) power source for supplying a first voltage level Vdd and configured to turn on in response to a gate voltage of a second voltage level Vss different from the first voltage level Vdd, and a plurality of second (NMOS) transistors electrically connected to a second (Vss) power source for supplying the second voltage level Vss and configured to turn on in response to a gate voltage of the first voltage level Vdd. The MUX 100 further includes a first node 110 between ones of the PMOS transistors and configured to take on or otherwise configured to receive each of the first voltage level Vdd, the second voltage level Vss, and a first floated voltage level, the first node voltage level depending at any given time on the input signals A0-A3, the select signal CLK4 and CLK8, and the first clock signal CLK2. The first floated voltage level is between and different from the first and second voltage levels Vdd and Vss.

In addition, the MUX 100 also includes a second node 120 between ones of the NMOS transistors and configured to take on or otherwise configured to receive each of the first voltage level Vdd, the second voltage level Vss, and a second floated voltage level, the second node voltage level depending at any given time on the input signals A0-A3, the select signal CLK4 and CLK8, and the first clock signal CLK2. The second floated voltage level is between and different from the first and second voltage levels Vdd and Vss. The MUX 100 further includes a third node 130 electrically connected to the first node 110 by one of the PMOS transistors and to the second node 120 by one of the NMOS transistors, and a pre-charge transistor 140 to electrically connect the third node 130 to the Vdd power source.

In another embodiment, the first clock signal CLK2 is configured to oscillate between the first voltage level Vdd and the second voltage level Vss. In one embodiment, the pre-charge transistor 140 is configured to turn on by the first clock signal CLK2 having the second voltage level Vss and the one of the NMOS transistors is configured to turn on by the first clock signal CLK2 having the first voltage level Vdd. In some embodiments, the one of the PMOS transistors is configured to turn on by the select signal CLK4. In one or more embodiments, the third node 130 is configured to dynamically store a complement of the selected input signal (one of A0-A3) in synchronization with the first clock signal CLK2 having the first voltage level Vdd. In one embodiment, the MUX 100 further includes an inverter circuit (between the third node 130 and a fourth node 150) driven by the third node 130 and configured to dynamically store the selected input signal at the fourth node 150 in synchronization with the first clock signal CLK2 having the first voltage level Vdd.

In some embodiments, the MUX 100 further includes a pair of inverter circuits (between the fourth node 150 and the output signal 170) driven by the fourth node 150 and configured to output the selected input signal in synchronization with the first clock signal CLK2 having the second voltage level Vss. In one or more embodiments, the plurality of input signals includes four input signals A0-A3 and the at least one select signal includes two select signals CLK4 and CLK8. In one embodiment, a serializing MUX includes such a MUX 100, where the two select signals include a second clock signal CLK4 having half the frequency of the first clock signal CLK2 and a third clock signal CLK8 having half the frequency of the second clock signal CLK4.

Referring again to FIG. 1, in one or more embodiments of the present disclosure, a true single-phase clocked (TSPC) serializing multiplexer (MUX) 100 for sequentially selecting and outputting each of a plurality of input signals A0-A3 in synchronization with a plurality of clock signals including a first clock signal CLK2 and at least one select clock signal CLK4 and CLK8 is provided. The serializing MUX 100 includes: a plurality of first (PMOS) transistors electrically connected to a first (Vdd) power source for supplying a first voltage level Vdd and configured to turn on in response to a gate voltage of a second voltage level Vss different from the first voltage level Vdd; a plurality of second (NMOS) transistors electrically connected to a second (Vss) power source for supplying the second voltage level Vss and configured to turn on in response to a gate voltage of the first voltage level Vdd; a first node 110 between ones of the PMOS transistors and configured to take on or otherwise configured to receive each of the first voltage level Vdd, the second voltage level Vss, and a first floated voltage level, the first node voltage level depending at any given time on the input signals A0-A3 and the clock signals CLK2, CLK4, and CLK8, the first floated voltage level being between and different from the first and second voltage levels Vdd and Vss; a second node 120 between ones of the NMOS transistors and configured to take on or otherwise configured to receive each of the first voltage level Vdd, the second voltage level Vss, and a second floated voltage level, the second node voltage level depending at any given time on the input signals A0-A3 and the clock signals CLK2, CLK4, and CLK8, the second floated voltage level being between and different from the first and second voltage levels Vdd and Vss; a third node 130 electrically connected to the first node 110 by one of the PMOS transistors and to the second node 120 by one of the NMOS transistors; and a pre-charge transistor 140 to electrically connect the third node 130 to the Vdd power source.

In some embodiments, each of the clock signals CLK2, CLK4, and CLK8 is configured to oscillate between the first voltage level Vdd and the second voltage level Vss, and each of the at least one select clock signal CLK4 and CLK8 is configured to oscillate at a clock cycle that is an integer multiple of the clock cycle of the first clock signal CLK2. In one embodiment, the pre-charge transistor 140 is configured to turn on by the first clock signal CLK2 having the second voltage level Vss and the one of the NMOS transistors is configured to turn on by the first clock signal CLK2 having the first voltage level Vdd.

In one or more embodiments, corresponding pluralities of the PMOS and NMOS transistors are configured to turn on by the plurality of input signals A0-A3 to generate inverted ones of the input signals A0-A3, and other ones of the PMOS and NMOS transistors are configured to turn on by the plurality of clock signals CLK2, CLK4, and CLK8 to sequentially select each of the inverted ones of the input signals A0-A3 and to sequentially dynamically store the selected inverted input signals A0-A3 at the third node 130 in synchronization with the first clock signal CLK2. In one embodiment, the at least one select clock signal includes a first select clock signal CLK4 and a second select clock signal CLK8, the first select clock signal CLK4 having half the frequency of the first clock signal CLK2 and the second select clock signal CLK8 having half the frequency of the first select clock signal CLK4.

Figure 6:
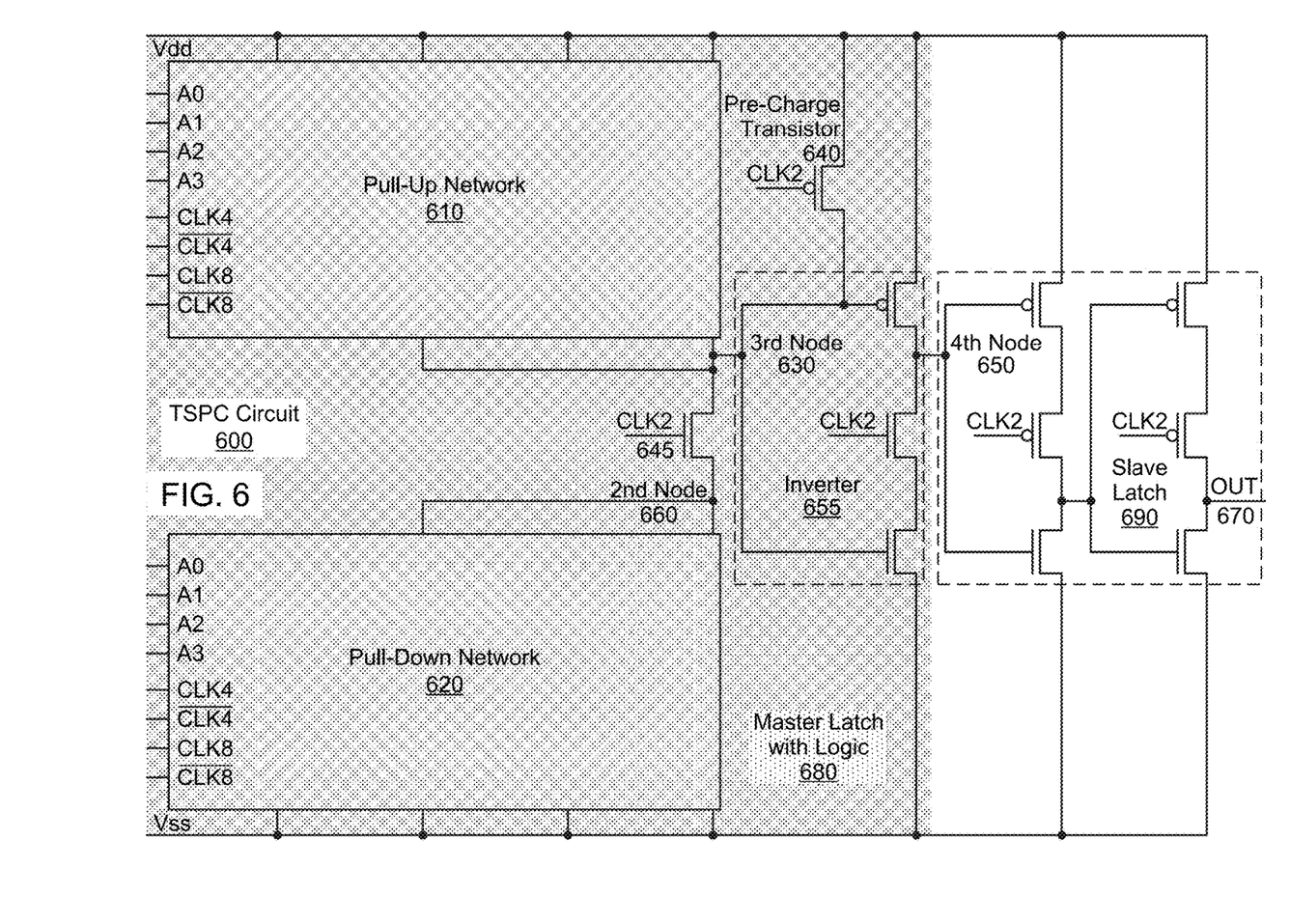
FIG. 6 is a circuit diagram of an example TSPC circuit, according to an embodiment of the present disclosure.

FIG. 6 is a circuit diagram of an example TSPC circuit 600, according to an embodiment of the present disclosure. The TSPC circuit 600 is a more generalized version of the TSPC serializing MUX 100 of FIG. 1. To the extent practical, names and reference numerals of the elements of the TSPC circuit 600 in FIG. 6 are the same or similar to their counterparts in the MUX 100 of FIG. 1.

In more detail, the TSPC circuit 600 includes a master latch (with logic) 680 and a slave latch 690 that are clocked by a single-phase clock signal CLK2 and supplied power from a high voltage source Vdd and a low voltage source Vss. The master latch 680 is the shaded portion of FIG. 6. The master latch 680 includes a pull-up network 610 (e.g., PMOS transistors arranged in a logical pattern) to control a third node 630, a complementary pull-down network 620 (e.g., NMOS transistors arranged in a corresponding complementary logical pattern) to control a second node 660, an NMOS transistor 645 to electrically connect the third node 630 to the second node 660 in synchronization with the first clock signal CLK2 having the high voltage, a pre-charge transistor 640 (in this case, a PMOS transistor) to initialize the third node 630 to high voltage in synchronization with the first clock signal CLK2 having the low voltage, and an inverter 655 to invert the voltage of the third node 630 and output the inverted voltage at a fourth node 650 in synchronization with the first clock signal CLK2 having the high voltage. In addition, the slave latch 690 includes a double inverter for outputting the voltage of the fourth node 650 at an output terminal (OUT) 670 in synchronization the first clock signal CLK2 having the low voltage.

For example, the pull-up network 610 (and complementary pull-down network 620) can receive four input signals A0, A1, A2, and A3 together with two (select) clock signals (e.g., second clock signal CLK4 and third clock signal CLK8 along with their complements). The output of the pull-up network 610 is delivered to the third node 630 while the output of the pull-down network 620 is delivered to the second node 660. When the first clock signal CLK2 is the low voltage, the third node 630 is initialized to the high voltage by the pre-charge transistor 640. Then, when the first clock signal CLK2 is the high voltage, the third node 630 takes on, remains at, or is otherwise set to the high voltage when the pull-up network 610 selects the input signal to be output, or the third node 630 takes on or is otherwise set to the low voltage when the pull-down network 620 selects the input signal to be output. By design, exactly one of the pull-up network 610 and the pull-down network 620 chooses the input signal to be output at any given time.

Thus, at any time, either the pre-charge transistor 640 is initializing the third node 630 to the high voltage or one of the pull-up network 610 and the pull-down network 620 is setting the third node 630 to one of the high voltage and the low voltage, respectively. Accordingly, the voltage level of the third node 630 does not float, and glitches do not occur at subsequent nodes (e.g., the fourth node 650) or the output terminal 670, even when a floating node (such as a first node) in the pull-up network 610 is electrically connected to the third node 630.

While the above-described embodiments of the present disclosure are directed primarily to a TSPC MUX circuit with a pre-charge transistor, the present disclosure is not so limited. For example, in other embodiments, the pre-charge transistor can be used in any embedded logic TSPC latch to electrically connect the high or low voltage level to a floating node, e.g., a node susceptible to charge sharing during clocked (or otherwise selected) logic for electrical connection to another such node. For instance, the pre-charge transistor could electrically connect a pull-up network of an embedded logic TSPC latch Numerous specific details have been set forth herein to provide a better understanding of some of the embodiments of the present disclosure. It will be understood, however, that other embodiments may be practiced without these specific details. In other instances, well known operations, components, and circuits have not been described in detail so as not to obscure the descriptions of specific embodiments described herein. It can be appreciated that the specific structural and functional details disclosed herein may be representative and do not necessarily limit the scope of the embodiments. In addition, although the subject matter has been described in language specific to structural features or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a true single-phase clocked (TSPC) multiplexer (MUX) for outputting one of a plurality of input signals in synchronization with a first clock signal and as selected by at least one select signal. The MUX includes: a plurality of first transistors electrically connected to a first power source for supplying a first voltage level and configured to turn on in response to a gate voltage of a second voltage level different from the first voltage level; a plurality of second transistors electrically connected to a second power source for supplying the second voltage level and configured to turn on in response to a gate voltage of the first voltage level; a first node between ones of the first transistors and having a voltage level configured to take on each of the first voltage level, the second voltage level, and a first floated voltage level, the first floated voltage level being between and different from the first and second voltage levels, the first node voltage level depending at any given time on the input signals, the select signal, and the first clock signal; a second node between ones of the second transistors and having a voltage level configured to take on each of the first voltage level, the second voltage level, and a second floated voltage level, the second floated voltage level being between and different from the first and second voltage levels, the second node voltage level depending at any given time on the input signals, the select signal, and the first clock signal; a third node electrically connected to the first node by one of the first transistors and to the second node by one of the second transistors; and a pre-charge transistor to electrically connect the third node to the first power source.

Example 2 includes the subject matter of Example 1, where the first clock signal is configured to oscillate between the first voltage level and the second voltage level.

Example 3 includes the subject matter of Example 2, where the pre-charge transistor is configured to turn on by the first clock signal having the second voltage level and the one of the second transistors is configured to turn on by the first clock signal having the first voltage level.

Example 4 includes the subject matter of Example 3, where the one of the first transistors is configured to turn on by the select signal.

Example 5 includes the subject matter of Example 3, where the third node is configured to dynamically store a complement of the selected input signal in synchronization with the first clock signal having the first voltage level.

Example 6 includes the subject matter of Example 1, further including an inverter circuit driven by the third node and configured to dynamically store the selected input signal at a fourth node in synchronization with the first clock signal having the first voltage level.

Example 7 includes the subject matter of Example 6, further including a pair of inverter circuits driven by the fourth node and configured to output the selected input signal in synchronization with the first clock signal having the second voltage level.

Example 8 includes the subject matter of Example 1, where the plurality of input signals includes four input signals and the at least one select signal includes two select signals.

Example 9 is a serializing MUX including the MUX of Example 8, where the two select signals include a second clock signal having half the frequency of the first clock signal and a third clock signal having half the frequency of the second clock signal.

Example 10 is a method of driving the MUX of Example 1. The method includes driving the pre-charge transistor with the first clock signal to pre-charge the third node in synchronization with the first clock signal, driving corresponding pluralities of the first and second transistors with the plurality of input signals to generate inverted ones of the input signals, and driving other ones of the first and second transistors with the select signal and the first clock signal to select one of the inverted input signals and to dynamically store the selected inverted input signal at the third node in synchronization with the first clock signal.

Example 11 includes the subject matter of Example 10, further including oscillating the first clock signal between the first voltage level and the second voltage level, where the driving of the pre-charge transistor includes driving the pre-charge transistor with the first clock signal having the second voltage level to pre-charge the third node in synchronization with the first clock signal having the second voltage level, and the driving of the other ones of the first and second transistors includes driving the one of the second transistors with the first clock signal having the first voltage level to dynamically store the selected inverted input signal at the third node in synchronization with the first clock signal having the first voltage level.

Example 12 includes the subject matter of Example 11, further including inverting the selected inverted input signal at the third node to dynamically store the selected input signal at a fourth node in synchronization with the first clock signal having the first voltage level.

Example 13 includes the subject matter of Example 12, further including double inverting the selected input signal at the fourth node to output the selected input signal in synchronization with the first clock signal having the second voltage level.

Example 14 includes the subject matter of Example 10, further including repeatedly cycling through combinations of the at least one select signal to sequentially select and output the plurality of input signals during a corresponding plurality of cycles of the first clock signal.

Example 15 includes the subject matter of Example 14, where the plurality of input signals includes four input signals and the at least one select signal includes a second clock signal and a third clock signal, the method further including driving the second clock signal at half the frequency of the first clock signal and driving the third clock signal at half the frequency of the second clock signal.

Example 16 is a true single-phase clocked (TSPC) serializing multiplexer (MUX) for sequentially selecting and outputting each of a plurality of input signals in synchronization with a plurality of clock signals including a first clock signal and at least one select clock signal. The serializing MUX includes: a plurality of first transistors electrically connected to a first power source for supplying a first voltage level and configured to turn on in response to a gate voltage of a second voltage level different from the first voltage level; a plurality of second transistors electrically connected to a second power source for supplying the second voltage level and configured to turn on in response to a gate voltage of the first voltage level; a first node between ones of the first transistors and having a voltage level configured to take on each of the first voltage level, the second voltage level, and a first floated voltage level, the first floated voltage level being between and different from the first and second voltage levels, the first node voltage level depending at any given time on the input signals and the clock signals; a second node between ones of the second transistors and having a voltage level configured to take on each of the first voltage level, the second voltage level, and a second floated voltage level, the second floated voltage level being between and different from the first and second voltage levels, the second node voltage level depending at any given time on the input signals and the clock signals; a third node electrically connected to the first node by one of the first transistors and to the second node by one of the second transistors; and a pre-charge transistor to electrically connect the third node to the first power source.

Example 17 includes the subject matter of Example 16, where each of the clock signals is configured to oscillate between the first voltage level and the second voltage level, and each of the at least one select clock signal is configured to oscillate at a clock cycle that is an integer multiple of the clock cycle of the first clock signal.

Example 18 includes the subject matter of Example 17, where the pre-charge transistor is configured to turn on by the first clock signal having the second voltage level and the one of the second transistors is configured to turn on by the first clock signal having the first voltage level.

Example 19 includes the subject matter of Example 16, where corresponding pluralities of the first and second transistors are configured to turn on by the plurality of input signals to generate inverted ones of the input signals, and other ones of the first and second transistors are configured to turn on by the plurality of clock signals to sequentially select each of the inverted ones of the input signals and to sequentially dynamically store the selected inverted input signals at the third node in synchronization with the first clock signal.

Example 20 includes the subject matter of Example 19, where the at least one select clock signal includes a first select clock signal and a second select clock signal, the first select clock signal having half the frequency of the first clock signal and the second select clock signal having half the frequency of the first select clock signal.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. In addition, various features, aspects, and embodiments have been described herein. The features, aspects, and embodiments are susceptible to combination with one another as well as to variation and modification, as will be understood in light of this disclosure. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A true single-phase clocked (TSPC) multiplexer (MUX) for outputting one of a plurality of input signals in synchronization with a first clock signal and as selected by at least one select signal, the MUX comprising:
    a plurality of first transistors electrically connected to a first power source for supplying a first voltage level and configured to turn on in response to a gate voltage of a second voltage level different from the first voltage level;
    a plurality of second transistors electrically connected to a second power source for supplying the second voltage level and configured to turn on in response to a gate voltage of the first voltage level;
    a first node between ones of the first transistors and having a voltage level configured to take on each of the first voltage level, the second voltage level, and a first floated voltage level, the first floated voltage level being between and different from the first and second voltage levels, the first node voltage level depending at any given time on the input signals, the select signal, and the first clock signal;
    a second node between ones of the second transistors and having a voltage level configured to take on each of the first voltage level, the second voltage level, and a second floated voltage level, the second floated voltage level being between and different from the first and second voltage levels, the second node voltage level depending at any given time on the input signals, the select signal, and the first clock signal;
    a third node electrically connected to the first node by one of the first transistors and to the second node by one of the second transistors; and
    a pre-charge transistor to electrically connect the third node to the first power source.

2. The MUX of claim 1, wherein the first clock signal is configured to oscillate between the first voltage level and the second voltage level.

3. The MUX of claim 2, wherein the pre-charge transistor is configured to turn on by the first clock signal having the second voltage level and the one of the second transistors is configured to turn on by the first clock signal having the first voltage level.

4. The MUX of claim 3, wherein the one of the first transistors is configured to turn on by the select signal.

5. The MUX of claim 3, wherein the third node is configured to dynamically store a complement of the selected input signal in synchronization with the first clock signal having the first voltage level.

6. The MUX of claim 1, further comprising an inverter circuit driven by the third node and configured to dynamically store the selected input signal at a fourth node in synchronization with the first clock signal having the first voltage level.

7. The MUX of claim 6, further comprising a pair of inverter circuits driven by the fourth node and configured to output the selected input signal in synchronization with the first clock signal having the second voltage level.

8. The MUX of claim 1, wherein the plurality of input signals comprises four input signals and the at least one select signal comprises two select signals.

9. A serializing MUX comprising the MUX of claim 8, wherein the two select signals comprise a second clock signal having half the frequency of the first clock signal and a third clock signal having half the frequency of the second clock signal.

10. A method of driving the MUX of claim 1, the method comprising:
    driving the pre-charge transistor with the first clock signal to pre-charge the third node in synchronization with the first clock signal;
    driving corresponding pluralities of the first and second transistors with the plurality of input signals to generate inverted ones of the input signals; and
    driving other ones of the first and second transistors with the select signal and the first clock signal to select one of the inverted input signals and to dynamically store the selected inverted input signal at the third node in synchronization with the first clock signal.

11. The method of claim 10, further comprising oscillating the first clock signal between the first voltage level and the second voltage level, wherein the driving of the pre-charge transistor comprises driving the pre-charge transistor with the first clock signal having the second voltage level to pre-charge the third node in synchronization with the first clock signal having the second voltage level, and the driving of the other ones of the first and second transistors comprises driving the one of the second transistors with the first clock signal having the first voltage level to dynamically store the selected inverted input signal at the third node in synchronization with the first clock signal having the first voltage level.

12. The method of claim 11, further comprising inverting the selected inverted input signal at the third node to dynamically store the selected input signal at a fourth node in synchronization with the first clock signal having the first voltage level.

13. The method of claim 12, further comprising double inverting the selected input signal at the fourth node to output the selected input signal in synchronization with the first clock signal having the second voltage level.

14. The method of claim 10, further comprising repeatedly cycling through combinations of the at least one select signal to sequentially select and output the plurality of input signals during a corresponding plurality of cycles of the first clock signal.

15. The method of claim 14, wherein the plurality of input signals comprises four input signals and the at least one select signal comprises a second clock signal and a third clock signal, the method further comprising driving the second clock signal at half the frequency of the first clock signal and driving the third clock signal at half the frequency of the second clock signal.

16. A true single-phase clocked (TSPC) serializing multiplexer (MUX) for sequentially selecting and outputting each of a plurality of input signals in synchronization with a plurality of clock signals including a first clock signal and at least one select clock signal, the serializing MUX comprising:

a plurality of first transistors electrically connected to a first power source for supplying a first voltage level and configured to turn on in response to a gate voltage of a second voltage level different from the first voltage level;

a plurality of second transistors electrically connected to a second power source for supplying the second voltage level and configured to turn on in response to a gate voltage of the first voltage level;

a first node between ones of the first transistors and having a voltage level configured to take on each of the first voltage level, the second voltage level, and a first floated voltage level, the first floated voltage level being between and different from the first and second voltage levels, the first node voltage level depending at any given time on the input signals and the clock signals;

a second node between ones of the second transistors and having a voltage level configured to take on each of the first voltage level, the second voltage level, and a second floated voltage level, the second floated voltage level being between and different from the first and second voltage levels, the second node voltage level depending at any given time on the input signals and the clock signals;

a third node electrically connected to the first node by one of the first transistors and to the second node by one of the second transistors; and a pre-charge transistor to electrically connect the third node to the first power source.

17. The serializing MUX of claim 16, wherein each of the clock signals is configured to oscillate between the first voltage level and the second voltage level, and each of the at least one select clock signal is configured to oscillate at a clock cycle that is an integer multiple of the clock cycle of the first clock signal.

18. The serializing MUX of claim 17, wherein the pre-charge transistor is configured to turn on by the first clock signal having the second voltage level and the one of the second transistors is configured to turn on by the first clock signal having the first voltage level.

19. The serializing MUX of claim 16, wherein corresponding pluralities of the first and second transistors are configured to turn on by the plurality of input signals to generate inverted ones of the input signals, and other ones of the first and second transistors are configured to turn on by the plurality of clock signals to sequentially select each of the inverted ones of the input signals and to sequentially dynamically store the selected inverted input signals at the third node in synchronization with the first clock signal.

20. The serializing MUX of claim 19, wherein the at least one select clock signal comprises a first select clock signal and a second select clock signal, the first select clock signal having half the frequency of the first clock signal and the second select clock signal having half the frequency of the first select clock signal.

* * * * *